United States Patent [19]
Wang et al.

[11] Patent Number: 5,254,890
[45] Date of Patent: Oct. 19, 1993

[54] GROUND BOUNCING REDUCING CIRCUIT AND METHOD

[75] Inventors: Ling-Ling Wang, Taipei Hsian; Sheau-Jiung Lee, Taipei, both of Taiwan

[73] Assignee: Acer Incorporated, Taipei, Taiwan

[21] Appl. No.: 821,965

[22] Filed: Jan. 16, 1992

[51] Int. Cl.$^5$ .................. H03K 5/12; H03K 17/16
[52] U.S. Cl. .................. 307/542.1; 307/443; 307/263
[58] Field of Search ............ 307/443, 572, 263, 542.1

[56] References Cited

U.S. PATENT DOCUMENTS

| | | | |
|---|---|---|---|
| 4,825,101 | 4/1989 | Walters, Jr. | 307/270 |
| 4,857,770 | 8/1989 | Partovi et al. | 307/443 |
| 4,880,997 | 11/1989 | Steele | 307/263 |
| 4,961,010 | 10/1990 | Davis | 307/443 |

Primary Examiner—Jin F. Ng
Assistant Examiner—Sinh Tran
Attorney, Agent, or Firm—Kenneth M. Kaslow

[57] ABSTRACT

A ground bouncing reducing circuit comprises a first control means, a second control means and an output means for generating an output signal at a fourth output terminal. The first control means generates a first control signal at a first output terminal and a second control signal at a second output terminal in response to an input signal. The first control signal and the second control signal are not asserted at the same time. The second control means generates a third control signal at a third output terminal in response to the first control signal and the second control signal. The ground bouncing phenomenon is reduced when the output signal changes state.

13 Claims, 3 Drawing Sheets

GROUND BOUNCING REDUCING CIRCUIT AND METHOD

BACKGROUND OF THE INVENTION

1. Field of the invention

The present invention relates generally to the ground voltage bouncing problem in electronic devices, and more particularly, to the ground bouncing problem due to the current discharge from the capacitive load when the output is switching.

2. Description of Related Art

The ground bouncing phenomenon is a voltage ground Vss fluctuation induced by switching of the outputs of an electronic device. The bouncing is exacerbated by multiple outputs simultaneous switching and may cause malfunction of circuits having Vss as a reference ground. FIG. 1 depicts a typical device circuit with only one detailed output stage model shown being coupled to a capacitive load. A typical electronic device, such as integrated circuits (IC), comprises 8, 16, 32 or even 64 shown output stages. As shown in the FIG. 1, the output signals 12 and 13 of the circuit 11 are coupled to the gate terminals of the MOS transistors M1, M2, respectively. The drain terminal of the MOS transistor M1 is coupled to the power supply Vcc through an inductance L3 and the source terminal of the MOS transistor M2 is coupled to the ground voltage through an inductance L2. The inductance L2 is associated with the inductance inherently existing on the wiring between the source terminal of transistor M2 and the output pin of the IC package. An output 14 is taken at the connection of the source terminal of transistor M1 and the drain terminal of transistor M2. The capacitance C1 is associated with the loading to which the output is coupled and the inductance L1 is a wiring inductance. A voltage Vss is taken at the source terminal of the transistor M2 to be utilized as a ground reference to the circuit 11. For example, the internal flip-flops of the circuit 11 need a reliable and predictable ground reference Vss for accurate operation. When output signal 14 is not switching, or not changing state, no current is flowing through the inductance L2 and the voltage of Vss is equal to GND. However, as the output signal 14 is switching from high to low in response to the state change of signals 12 and 13, a current I is quickly discharging from the capacitive load C1 through inductance L1, MOS transistor M2 and inductance L2 to GND. The instantaneous value of the current I is equal to $c1*dV/dt$. The instantaneous value of the Vss induced is, therefore, equal to $L2*dI/dt$. The voltage induced on the source terminal of transistor M2 results in a ground voltage bouncing of Vss, and is known as the ground bouncing phenomenon in the art. The voltage induced at Vss will be substantial when a multiple of outputs are switching at the same time. For instance, as sixteen outputs switches from high to low voltage at the same time, the induced voltage is equal to $16*L2*dI/dt$. A significant fluctuation of the Vss beyond a tolerance limit will cause malfunction of the circuits having Vss as a reference ground.

SUMMARY OF THE INVENTION

Accordingly, the present invention provides a circuit that reduces ground bouncing caused by a capacitive load. In particular, the present invention reduces ground bouncing while either a single or multiple outputs are switching at the same time. The ground bouncing reducing circuit of the present invention preferably comprises: a first control means for generating a first control signal at a first output terminal and a second control signal at a second output terminal in response to an input signal, the first control signal and the second control signal not being asserted at the same time; a second control means for generating a third control signal at a third output terminal in response to the first control signal and the second control signal; and an output means for generating an output signal at a fourth output terminal in response to the first control signal and the third control signal; whereby the ground bouncing phenomenon is reduced when the output signal is changing state.

A further understanding of the nature and advantage of the present invention may be realized by reference to the Detailed Description of the Invention and the attached drawings.

DETAILED DESCRIPTION OF THE INVENTION

Figure 1:
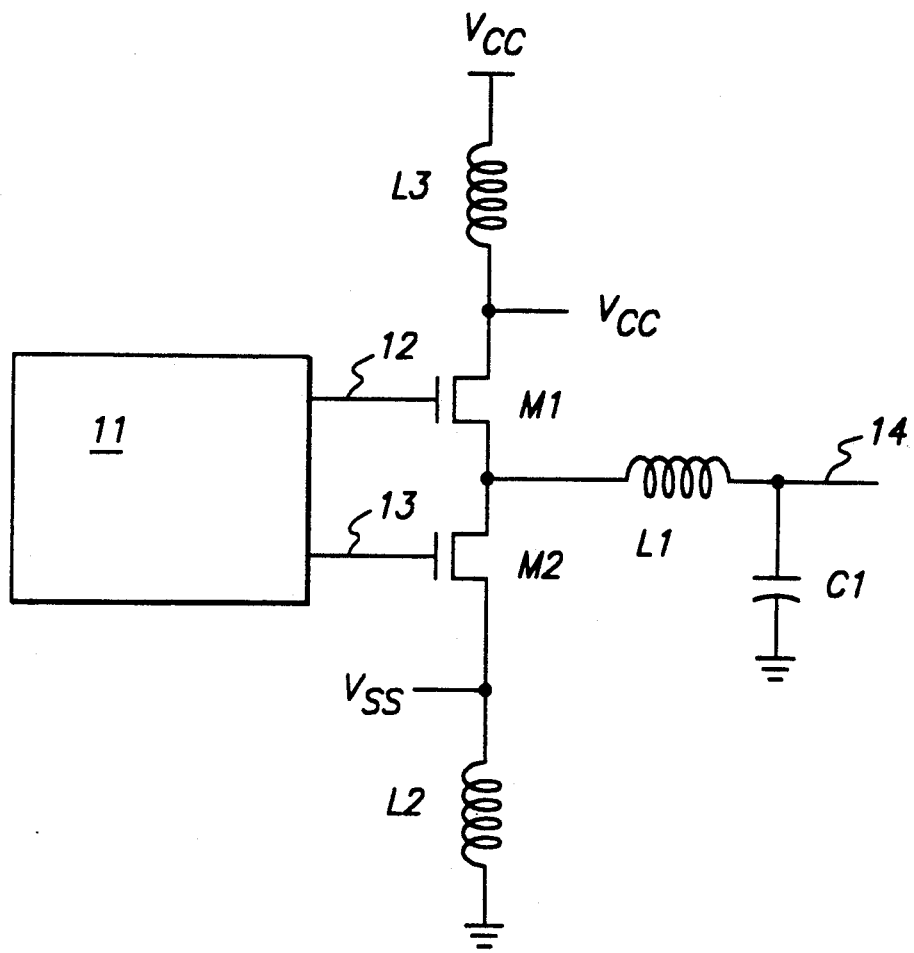
FIG. 1 shows an electronic device with a detailed output stage shown being coupled to a load in accordance with the conventional art.
Figure 2:
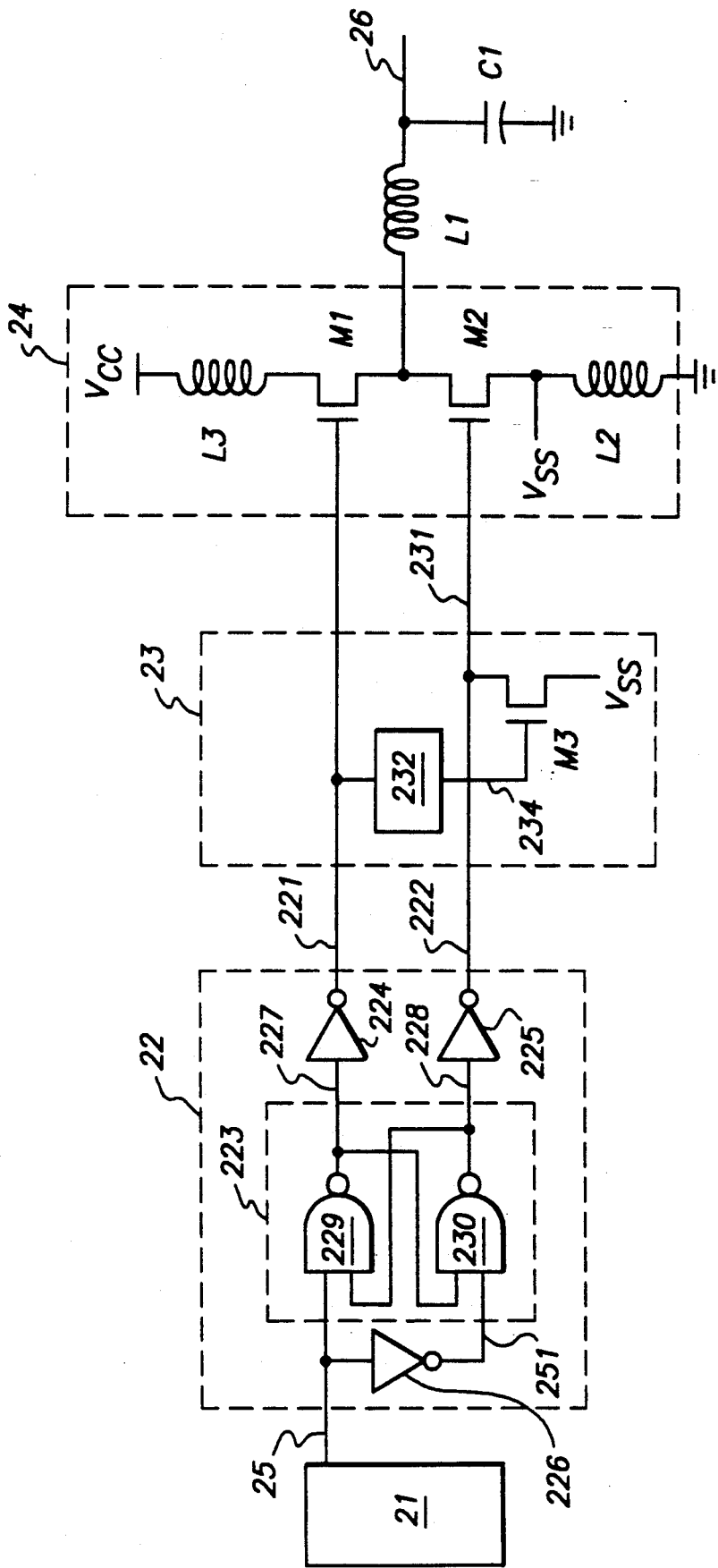
FIG. 2 shows a preferred embodiment of the ground bouncing reducing circuit in accordance with the present invention.

As shown in the FIG. 2, the present invention comprises a first control circuit 22, a second control circuit 23 and an output circuit 24. The invention receives an input signal 25 from the circuit 21 for controlling the output 26. In response to the input signal 25, the first control circuit 22 generates a first control signal 221 and a second control signal 222. The first control signal 221 and second control signal 222 are not asserted at the same time by the first control circuit 22. In a preferred embodiment of the invention, the signals 221 and 222 are high when asserted. In response to the first control signal 221 and the second control signal 222, the second control circuit 23 generates a third control signal 231. In response to the first control signal 221 and the third control signal 231, the output circuit 24 generates an output signal 26 with much smaller slope. As a result, the ground bouncing phenomenon associated with the Vss is reduced to a minimum level when the output signal 26 is switching.

A preferred embodiment of the first control circuit 22 is disclosed in the FIG. 2. The first control circuit 22 comprises a set-reset flip-flop 223 and two inverters 224 and 225. The set-reset flip-flop 223 has a first input coupled to the input signal 25 and a second input coupled to the input signal 25 through an inverter 226. The flip-flop 223 has a set output signal 227 and a reset output signal 228. The first inverter 224 has an input coupled to the set output signal 227 and the output of the inverter 224 is the first control signal 221. The second inverter 225 has an input coupled to the reset output signal 228 and the output of the inverter 225 is the second control signal 222.

A preferred embodiment of the second control circuit 23 is also shown in FIG. 2. The second control circuit 23 comprises a delay circuit 232 and MOS transistor M3. The delay circuit 232 outputs a fifth control signal 234 by delaying the first control signal a certain amount of time in response to the first control signal 221. The MOS transistor M3 has a drain terminal coupled to the second control signal 222, a source terminal coupled to the internal ground Vss and a gate terminal coupled to the fifth control signal 234. The output terminal provides signal 231 and is coupled to the drain terminal of the MOS M3.

One preferred embodiment of the output circuit 24 is also shown in the FIG. 2. The output circuit 24 has a first MOS transistor M1 and a second MOS transistor M2 connected in cascode. The first MOS transistor M1 has a drain terminal coupled to Vcc through an inductance L3, a gate terminal coupled to the first control signal 221 and a source terminal. The second MOS transistor M2 has a drain terminal coupled to the source terminal of the first MOS transistor M1 to form the output terminal for signal 26, a source terminal coupled to the ground through the wiring inductance L2 and a gate terminal coupled to the third control signal 231.

Figure 3:
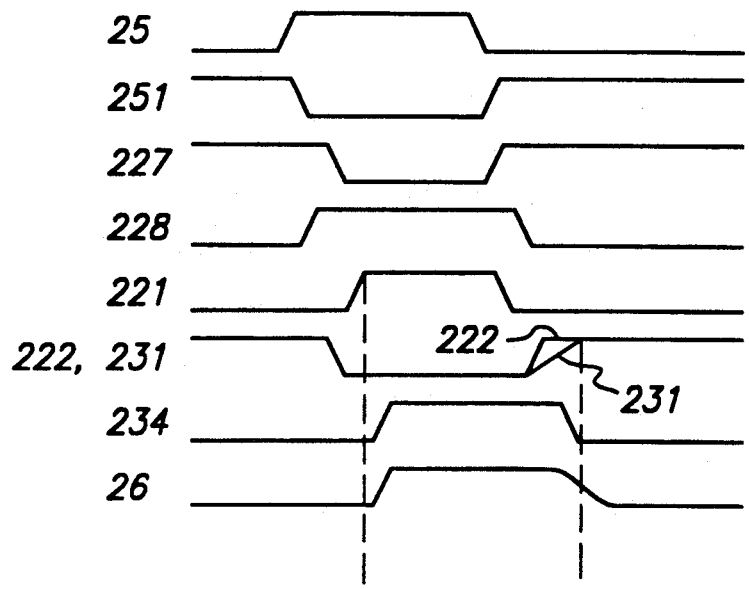
FIG. 3 is a timing diagram of related signals for the circuit of FIG. 2.

As a NMOS transistor is preferably employed as transistors M1, M2 and M3 in the present invention, and the timing of the related signals is disclosed in FIG. 3. As shown, the control signal 221 is asserted only when the control signal 222 is de-asserted, and vice versa. By this arrangement, the NMOS transistors M1 and M2 will not be open at the same time. Thus, no current path existed between Vcc and ground when the output signal 26 is switching. The discharge current only comes from the load capacitance C1 and not from the power supply.

By comparing the signal 222 and 231, it can be seen that the second control circuit 23 slows down the turn-on speed of the sink transistor M2. This avoids sinking large amounts of current being generated in a short time when discharging occurs. The slow decay of the charge density of the load capacitance C1 may smooth the transition of the output waveform. As a result, minimization of ground bouncing is possible by the second control circuit 23.

Figure 4:
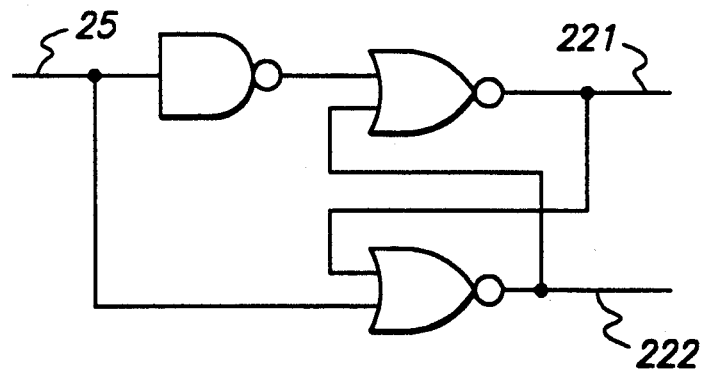
FIG. 4 shows an alternate preferred embodiment of the first control means.

As the details of the block 223 show, a preferred embodiment of the flip-flop 223 comprises a first logic and a second logic circuit 229, 230 for performing NAND functions. The first logic circuit 229 has an input coupled to the first input 25 and the second logic circuit 230 has an input coupled to the second input 251. A straight forward implementation of the logic circuit 229, 230 is a NAND gate but other alternatives are possible understood by persons skillful in the art. An alternative embodiment of the block 22 is shown in FIG. 4. It may be easily proved the signal 221 and 222 take the same form as that shown in FIG. 3.

While the above description provides a full and complete description of the preferred embodiments of the present invention, various modifications, alternate constructions, and equivalents may be employed while still remaining within the scope of the invention. For example, to average skillful person in the art, the PMOS transistor replacement of the NMOS transistor shown in our preferred embodiment together with some minor modifications of associated circuit may still achieve the function of the invention. Therefore, the above description and illustrations should not be construed as limiting the scope of the invention which is defined by the following claims.

What is claimed is:

1. For an output circuit having a current sinking means for discharging current from a load, a ground bouncing reducing circuit comprising:
   a first control means for generating a first voltage control signal at a first output terminal and a second voltage control signal at a second output terminal in response to an input signal, the first control signal and the second control signal not being asserted at the same time; and
   a second control means for providing an activation signal at a third output terminal to activate and current sinking means, said second control means comprising a delay means coupled to receive said first control signal for generating a third control signal which is a delayed version of said first control signal, and a signal regulating means coupled to receive said third control signal and controlled by said third control signal for gradually passing the second control signal as said activation signal to the current sinking means of the output circuit to slowly activate said sinking means, thereby, allowing the current sinking means to slowly discharge current from said load to reduce ground bouncing.

2. The ground bouncing reducing circuit of claim 1, wherein the voltages of the first and second control signals are high when asserted.

3. The ground bouncing reducing circuit of claim 1, wherein the first control means comprises:
   a set-reset flip-flop, having a first input coupled to said input signal and a second input coupled to said input signal through an inverter, the flip-flop having a set output and a reset output; and
   a first inverter having an input coupled to the set output, said first inverter having an output coupled to said first output terminal;
   a second inverter having an input coupled to the reset output, said second inverter having an output coupled to said second output terminal.

4. The ground bouncing reducing circuit of claim 3, wherein the set-reset flip-flop comprises a first and a second logic means each performing a NAND function, the first logic means having an input coupled to receive the input signal, the second logic means having an input coupled to receive the input signal through an inverter.

5. The ground bouncing reducing circuit of claim 4, wherein the logic means is a NAND gate.

6. The ground bouncing reducing circuit of claim 1, wherein the signal regulating means comprises:
   a MOS transistor having a drain terminal coupled to receive the second control signal, a source terminal coupled to an internal ground and a gate terminal coupled to the delay means to receive the third control signal, the third output terminal being coupled to the drain terminal.

7. The ground bouncing reducing circuit of claim 6, wherein the MOS transistor is a NMOS transistor.

8. For a circuit device having an output stage coupled to a capacitive load, said output stage comprising a first MOS transistor and a second MOS transistor connected in cascode, the first MOS transistor having a drain terminal, a source terminal and a gate terminal, the drain terminal coupled to Vcc, the second MOS transistor has a drain terminal, a source terminal and a gate terminal, the source terminal of the first MOS transistor coupled to the drain terminal of the second MOS transistor at an output terminal for outputting an output signal, the source terminal of the second MOS transistor coupled to ground, a method for reducing ground bouncing in said circuit device comprising the steps of:

receiving a first and a second input control signals;

passing the first control signal to the gate terminal of the first MOS transistor;

generating in response to the first control signal a delay control signal which is a delayed version of the first control signal; and in response to the delay control signal, gradually passing the second control signal to the gate terminal of the second MOS transistor to slowly activate the second MOS transistor to allow the second MOS transistor to slowly sink the current stored in the capacitive load.

9. A ground bouncing reducing circuit comprising:

a first control means for generating a first control signal at a first output terminal and a second control signal at a second output terminal in response to an input signal, the first control signal and the second control signal not being asserted at the same time, said first control means comprising a set-reset flip-flop, a first inverter, and a second inverter, said flip-flop having a first input coupled to the input signal and a second input coupled to the input signal through an inverter, the flip-flop having a set output and a reset output, said first inverter having an input coupled to the set output and an output coupled to said first output terminal, and said second inverter having an input coupled to the reset output and an output coupled to the second output terminal;

a second control means for generating a third control signal at a third output terminal in response to the first control signal and the second control signal; and an output means for generating an output signal at a fourth output terminal in response to the first control signal and the third control signal.

10. The ground bouncing reducing circuit of claim 9, wherein the set-reset flip-flop comprises a first and a second logic means each performing a NAND function, the first logic means having an input coupled to receive the input signal, the second logic means having an input coupled to receive the input signal through an inverter.

11. The ground bouncing reducing circuit of claim 10, wherein the logic means is a NAND gate.

12. The ground bouncing reducing circuit of claim 9, wherein the output means comprises:

a first MOS transistor having a drain terminal coupled to a voltage source, a gate terminal coupled to receive the first control signal, and a source terminal; and a second MOS transistor coupled in cascode with the first transistor, said second transistor having a drain terminal coupled to the source terminal of the first transistor to form the fourth output terminal, a gate terminal coupled to receive the third control signal, and a source terminal coupled to ground.

13. The ground bouncing reducing circuit of claim 12, wherein the first and second MOS transistors are NMOS transistors.

* * * * *